(12) United States Patent
Quick

(10) Patent No.: US 6,939,748 B1
(45) Date of Patent: Sep. 6, 2005

(54) NANO-SIZE SEMICONDUCTOR COMPONENT AND METHOD OF MAKING

(76) Inventor: Nathaniel R. Quick, 894 Silverado Ct., Lake Mary, FL (US) 32746

( * ) Notice: Subject to any disclaimer, the term of this patent is extended or adjusted under 35 U.S.C. 154(b) by 0 days.

(21) Appl. No.: 10/684,930

(22) Filed: Oct. 13, 2003

(51) Int. Cl.$^7$ ............................................ H01L 21/335
(52) U.S. Cl. ...................... 438/142; 435/105; 435/613; 435/519; 435/522; 435/268; 435/931; 435/965
(58) Field of Search ................................ 438/142, 105, 438/613, 519, 522, 965, 268, 931

(56) References Cited

U.S. PATENT DOCUMENTS

| | | |
|---|---|---|
| 3,214,315 A | 10/1965 | Hildebrand |
| 3,396,401 A | 8/1968 | Nonomura |
| 3,419,321 A | 12/1968 | Barber et al. |
| 3,874,240 A | 4/1975 | Rembaum |
| 3,945,318 A | 3/1976 | Landsman |
| 4,159,414 A | 6/1979 | Suh et al. |
| 4,309,224 A | 1/1982 | Shibata |
| 4,339,285 A | 7/1982 | Pankove |
| 4,372,989 A | 2/1983 | Menzel |
| 4,496,607 A | 1/1985 | Mathias |
| 4,539,251 A | 9/1985 | Sugisawa et al. |
| 4,565,712 A | 1/1986 | Noguchi et al. |
| 4,620,264 A | 10/1986 | Ushifusa et al. |
| 4,624,934 A | 11/1986 | Kokubu et al. |
| 4,663,826 A | 5/1987 | Baeuerle |
| 4,761,339 A | 8/1988 | Komatsu et al. |
| 4,791,239 A | 12/1988 | Shirahata et al. |
| 4,840,853 A | 6/1989 | Iio et al. |
| 4,847,138 A | 7/1989 | Boylan et al. |
| 4,860,442 A | 8/1989 | Ainsworth et al. |
| 4,880,770 A | 11/1989 | Mir et al. |
| 4,912,087 A | 3/1990 | Aslam et al. |
| 4,924,033 A | 5/1990 | Iyogi et al. |
| 4,950,558 A | 8/1990 | Sarin |
| 4,988,564 A | 1/1991 | D'Angelo et al. |
| 5,015,618 A | 5/1991 | Levinson |
| 5,055,967 A | 10/1991 | Sukonnik et al. |
| 5,145,741 A | 9/1992 | Quick |
| 5,180,440 A | 1/1993 | Siegel et al. |
| 5,391,841 A | 2/1995 | Quick |
| 5,459,098 A | 10/1995 | Maya |
| 5,493,096 A | 2/1996 | Koh |
| 5,629,532 A | 5/1997 | Myrick |

(Continued)

OTHER PUBLICATIONS

Salama et al., Laser Direct Write for Wide-band gap Semiconductor Fabrication: Doping, (Compound Semiconductors, 2003 International Symposium, pp 102-103, Aug. 25-27, 2003).*

(Continued)

*Primary Examiner*—David Zarneke
*Assistant Examiner*—Igwe U. Anya
(74) *Attorney, Agent, or Firm*—Frijouf, Rust & Pyle, P.A.

(57) ABSTRACT

A method is disclosed for making a nano-size semiconductor component within a wide-bandgap semiconductor substrate. A first thermal energy beam is directed onto a first portion of the wide-bandgap semiconductor substrate to change the structure of the wide-bandgap semiconductor substrate into a first element of the semiconductor component. A second thermal energy beam is directed onto a second portion of the wide-bandgap semiconductor substrate adjacent to the first portion to form a second element of the semiconductor component.

30 Claims, 10 Drawing Sheets

U.S. PATENT DOCUMENTS

| | | | |
|---|---|---|---|
| 5,695,828 | A | 12/1997 | Ghosh et al. |
| 5,733,609 | A | 3/1998 | Wang |
| 5,837,607 | A | 11/1998 | Quick |
| 5,847,418 | A | 12/1998 | Nakamura et al. |
| 5,889,234 | A | 3/1999 | Ghosh et al. |
| 6,025,609 | A | 2/2000 | Quick |
| 6,054,375 | A | 4/2000 | Quick |
| 6,255,671 | B1 | 7/2001 | Bojarczuk, Jr. et al. |
| 6,271,576 | B1 * | 8/2001 | Quick ................... 257/588 |
| 6,670,693 | B1 * | 12/2003 | Quick ................... 257/588 |
| 2003/0089899 | A1 * | 5/2003 | Lieber et al. ............ 257/9 |
| 2004/0145053 | A1 * | 7/2004 | Auner et al. ............ 257/737 |

OTHER PUBLICATIONS

K. G. Krelder, D. R. F. Burgess, Jr., M. J. Tarlov, G. Gilen, W. Wright, R. Lareau and L. M. Casas, "Laser Transformed SIC Thin Films," Materials Research Society Symposium Proceedings, vol. 339.

D. K. Sengupta, N. R. Quick and A. Kar, "Laser Direct Write of Conducting and Insulating Tracks in Sillcone Carbide," Materials Research Society Symposium Proceedings, vol. 624.

D. K. Sengupta, N. R. Quick and A. Kar, "Laser Synthesis of Ohmic Contacts in Silicone Carbide Having Schottky Diode Characteristics Before Laser Treatment,".

D. K. Sengupta, N. R. Quick and A. Kar, "Laser Conversion of Electrical Properties for Silicon Carbide Device Applications," Journal of Laser Applications p. 28, vol. 13, No. 1, Feb. 2001.

Nathaniel R. Quick, "Laser Synthesis of Conductive Phases in Silicone Carbide and Aluminum Nitride," The Minerals, Metals & Materials Society, 1995.

* cited by examiner

NANO-SIZE SEMICONDUCTOR COMPONENT AND METHOD OF MAKING

BACKGROUND OF THE INVENTION

1. Field of the Invention

This invention relates to semiconductor electronic devices and circuits such as integrated electronic circuitry and more particularly to an improved apparatus and method for the fabrication of a nano-size semiconductor component within wide-bandgap semiconductor substrates such as a field effect transistor.

2. Background of the Invention

Certain ceramics, such as silicon carbide (SiC) and aluminum nitride (AlN), are known to exhibit electrical properties ranging from insulating to semiconducting to conducting, as discussed in U.S. Pat. No. 5,145,741 issued Sep. 8, 1992, entitled "Converting Ceramic Materials to Electrical Conductors and Semiconductors" issued to Nathaniel R. Quick, and U.S. Pat. No. 5,391,841 issued Feb. 21, 1995, entitled "Laser Processed Coatings on Electronic Circuit Substrates" issued to Nathaniel R. Quick. The wide-bandgap semiconductor phases of these ceramics and other wide-bandgap semiconductors including diamond, are used to create devices such as conductive tabs, interconnects, vias, wiring patterns, resistors, capacitors, semiconductor devices and the like electronic components by laser synthesis on the surfaces and within the body of such wide-bandgap semiconductor to thereby eliminate photolithography processes which require numerous steps and generate undesirable chemical pollutants when processing such traditional electronic devices, components and circuitry.

It is well known alumina ($Al_2O_3$) dominates the dielectric market as an integrating substrate or device carrier in electronics packaging. BN, AlN, SiC and diamond are also of interest, due to the thermal coefficient of expansion (TCE) and for the dielectric constant and higher thermal conductivity than that of $Al_2O_3$. SiC, AlN, BN, GaN and diamond also exhibit a wide-band gap and chemical resistance as well as exhibiting properties from a semiconductor to an insulator. These properties are of substantial interest for high temperature applications approaching 1000° C. and for aggressive environment applications. In addition, these properties are desirable for high density integrated circuit packing.

In the prior art, metallization methods, including dry-film imaging and screen printing have been used for the production of conductive patterns on alumina. However, metal compatibility difficulties with high thermal conductivity ceramic materials such as AlN and SiC, have not been completely solved. Copper and silver paste exhibits a TCE mismatch aggravated by high temperatures as well as being subject to oxidation that increases the resistivity. In particular, bonding of copper to AlN has proved to be nontrivial. Alumina or stoichiometric aluminum oxynitride (AlON) coatings must be developed on the AlN surface through passivation processes. These passivation processes have poor reproducibility. Thus, the direct laser synthesis of conductors in AlN, SiC and diamond substrates appears to provide solutions to this long standing prior art problem with regard to metallization and for more simple processing techniques for creating devices and circuitry that are compatible with selected ceramic substrates, while satisfying the need for higher temperature, aggressive environment, and higher density integrated circuit packaging applications.

The following U.S. Patents illustrate apparatuses and methods represent some of the attempts of the prior art for developing conductor and semiconductor components.

U.S. Pat. No. 5,906,708 to Robinson et al discloses silicon-germanium-based compositions comprising silicon, germanium, and carbon (Si—Ge—C), methods for growing Si—Ge—C— C epitaxial layer(s) on a substrate, etchants especially suitable for Si—Ge—C etch-stops, and novel methods of use for Si—Ge—C compositions. In particular, the invention relates to Si—Ge—C compositions, especially for use as etch-stops and related processes and etchants useful for microelectronic and nanotechnology fabrication.

U.S. Pat. No. 5,961,877 to Robinson et al discloses silicon-germanium-based compositions comprising silicon, germanium, and carbon Si—Ge—C, methods for growing Si—Ge—C epitaxial layer(s) on a substrate, etchants especially suitable for Si—Ge—C etch-stops, and novel methods of use for Si—Ge—C compositions. In particular, the invention relates to Si—Ge—C compositions, especially for use as etch-stops and related processes and etchants useful for microelectronic and nanotechnology fabrication.

U.S. Pat. No. 6,064,081 to Robinson et al discloses silicon-germanium-based compositions comprising silicon, germanium, and carbon (Si—Ge—C), methods for growing Si—Ge—C epitaxial layer(s) on a substrate, etchants especially suitable for Si—Ge—C etch-stops, and novel methods of use for Si—Ge—C compositions. In particular, the invention relates to Si—Ge—C compositions, especially for use as etch-stops and related processes and etchants useful for microelectronic and nanotechnology fabrication.

U.S. Pat. No. 6,221,154 to Lee et al. discloses a method and an apparatus developed to grow beta-silicon carbide nanorods, and prepare patterned field-emitters using different kinds of chemical vapor deposition methods. The apparatus includes graphite powder as the carbon source, and silicon powder as silicon sources. Metal powders (Fe, Cr and/or Ni) are used as catalyst. Hydrogen was the only feeding gas to the system.

U.S. Pat. No. 6,274,234 to Dujardin et al. discloses atomic wires of great length and great stability formed on the surface of a SiC substrate as straight chains of dimers of an element chosen from amongst SiC and C. In order to produce same, layers of the element are formed on the surface and the assembly is constructed by means of annealings of the surface provided with the layers. The resulting wires have application to nanoelectronics.

U.S. Pat. No. 6,313,015 to Lee et al. discloses silicon nanowires and silicon nanoparticle chains formed by the activation of silicon monoxide in the vapor phase. The silicon monoxide source may be solid or gaseous, and the activation may be by thermal excitation, laser ablation, plasma or magnetron sputtering. The present invention produces large amounts of silicon nanowires without requiring the use of any catalysts that may cause contamination.

U.S. Pat. No. 6,334,939 to Zhou et al. discloses a nanostructure based material capable of accepting and reacting with an alkali metal such as lithium. The material exhibits a reversible capacity ranging from at least approximately 900 mAh/g-1,500 mAh/g. The high capacity of the material makes it attractive for a number of applications, such as a battery electrode material.

U.S. Pat. No. 6,407,443 to Chen et al. discloses a method for forming a platen useful for forming nanoscale wires for device applications comprising: (a) providing a substrate having a major surface; (b) forming a plurality of alternating layers of two dissimilar materials on the substrate to form a stack having a major surface parallel to that of the substrate;

(c) cleaving the stack normal to its major surface to expose the plurality of alternating layers; and (d) etching the exposed plurality of alternating layers to a chosen depth using an etchant that etches one material at a different rate than the other material to thereby provide the surface with extensive strips of indentations and form the platen useful for molding masters for nano-imprinting technology. The pattern of the platen is then imprinted into a substrate comprising a softer material to form a negative of the pattern, which is then used in further processing to form nanowires. The nanoscale platen thus comprises a plurality of alternating layers of the two dissimilar materials, with the layers of one material etched relative the layers of the other material to form indentations of the one material. The platen is then oriented such that the indentations are perpendicular to a surface to be imprinted.

U.S. Pat. Nos. 5,391,841, 5,837,607, 6,025,609, 6,054,375 and 6,271,576 issued to Nathaniel R. Quick disclosed apparatuses and processes for making micro-size conductive elements and electronic components by the laser synthesis of a wide-bandgap semiconductor substrate.

In my U.S. patent application Ser. No. 10/262,310 filed Sep. 30, 2002, I disclosed an improved apparatus and method for the fabrication of a nano-size conductive element within wide-bandgap semiconductor substrate. The disclosure of U.S. Pat. Nos. 5,391,841, 5,837,607, 6,025,609, 6,054,375 and 6,271,576 and U.S. patent application Ser. No. 10/262,310 filed Sep. 30, 2002 are hereby incorporated by reference into the present application.

It is an object of this invention to improve upon the above inventions by providing a method for the fabrication of a nano-size semiconductor component within wide-bandgap semiconductor substrates.

Another object of this invention is to provide a method for the fabrication of a nano-size semiconductor component within wide-bandgap semiconductor substrates that is formed in-situ within a wide-bandgap semiconductor substrate.

Another object of this invention is to provide a method for the fabrication of a nano-size semiconductor component within wide-bandgap semiconductor substrates that is formed by a thermal energy beam including a beam of electromagnetic radiation or a beam of charged particles or the like.

Another object of this invention is to provide a method for the fabrication of a nano-size field effect transistor semiconductor component within wide-bandgap semiconductor substrates.

The foregoing has outlined some of the more pertinent objects of the present invention. These objects should be construed as being merely illustrative of some of the more prominent features and applications of the invention. Many other beneficial results can be obtained by modifying the invention within the scope of the invention. Other objects and a full understanding of the invention may be had by referring to the summary of the invention, the detailed description setting forth the preferred embodiment in addition to the scope of the invention defined by the claims taken in conjunction with the accompanying drawings.

SUMMARY OF THE INVENTION

The present invention is defined by the appended claims with specific embodiments being shown in the attached drawings. For the purpose of summarizing the invention, the invention is incorporated into a method for making a nano-size semiconductor component within a wide-bandgap semiconductor substrate. The method comprises the steps of providing a wide-bandgap semiconductor substrate. A first thermal energy beam is directed onto a first portion of the wide-bandgap semiconductor substrate for heating the first portion to change the structure of the first portion of the wide-bandgap semiconductor substrate into a first element of a semiconductor component. A second thermal energy beam is directed onto a second portion of the wide-bandgap semiconductor substrate adjacent to the first portion of the wide-bandgap semiconductor substrate for heating the second portion to form a second element of the semiconductor component.

In a more specific example of the invention, one of the first and second thermal energy beams may be a beam of charged particles, a beam of electrons, a beam of ions or a beam of electromagnetic radiation such as a laser beam.

In another specific example, the invention is incorporated into a method for making a nano-size field effect transistor within a wide-bandgap semiconductor substrate. The method comprises providing a wide-bandgap semiconductor substrate of essentially a single crystal compound. A first thermal energy beam is directed onto a first portion of the wide-bandgap semiconductor substrate for heating the first portion to change the crystalline structure of the first portion of the wide-bandgap semiconductor substrate into a gate of the nano-size field effect transistor. A second thermal energy beam is directed onto a second portion of the wide-bandgap semiconductor substrate adjacent to the first portion of the wide-bandgap semiconductor substrate for forming a source of the of the nano-size field effect transistor. A third thermal energy beam is directed onto a third portion of the wide-bandgap semiconductor substrate adjacent to the first portion of the wide-bandgap semiconductor substrate for forming a drain of the of the nano-size field effect transistor.

The foregoing has outlined rather broadly the more pertinent and important features of the present invention in order that the detailed description that follows may be better understood so that the present contribution to the art can be more fully appreciated. Additional features of the invention will be described hereinafter which form the subject of the claims of the invention. It should be appreciated by those skilled in the art that the conception and the specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a fuller understanding of the nature and objects of the invention, reference should be made to the following detailed description taken in connection with the accompanying drawings in which.

Similar reference characters refer to similar parts throughout the several Figures of the drawings.

DETAILED DISCUSSION

Figure 1:
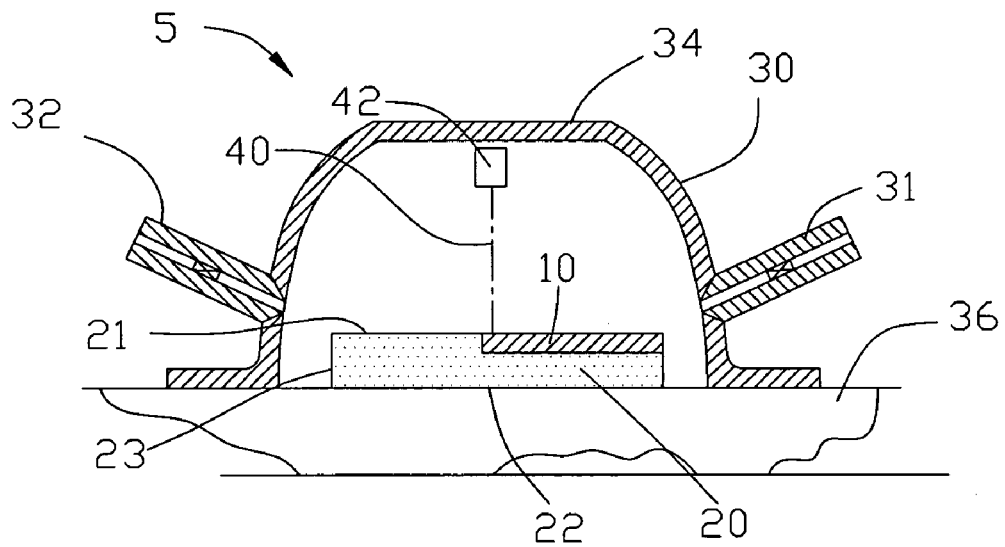
FIG. 1 is a side view of an air-tight chamber with a thermal energy beam impinging on a wide-bandgap semiconductor substrate for forming a nano-size conductive element.

FIG. 1 is a side view of an apparatus 5 for forming a nano-size conductive element 10 on a wide-bandgap semiconductor substrate 20. The wide-bandgap semiconductor substrate 20 is shown located in an air-tight chamber 30. The chamber 30 has an inlet and valve combination 31 and outlet and valve combination 32 connected to the side wall of the chamber 30 for injecting and removing gases into and therefrom, respectively. The chamber 30 may optionally include an air-tight laser beam transmission window 34 disposed for transmitting a laser beam into the chamber 30. The chamber 30 is dispose on a support member 36 forming an airtight seal therewith.

Figure 2:
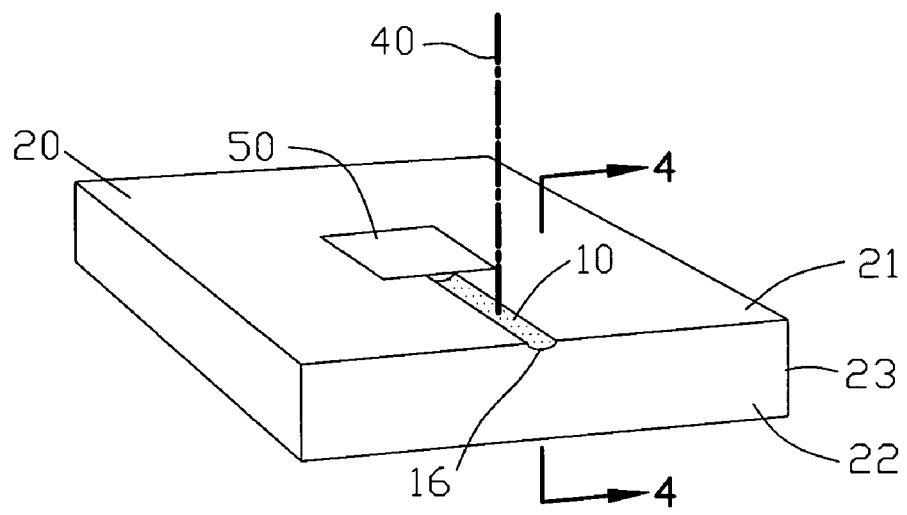
FIG. 2 is an enlarged isometric view of the nano-size conductive element formed on the wide-bandgap semiconductor substrate of FIG. 1.

FIG. 2 is an enlarged isometric view of the wide-bandgap semiconductor substrate 20 shown in FIG. 1. The wide-bandgap semiconductor substrate 20 defines a first and a second side 21 and 22 and a peripheral edge 23. Although the wide-bandgap semiconductor substrate 20 is shown as having a square, the present invention is not limited by the physical configuration of the wide-bandgap semiconductor substrate 20 as shown herein.

A thermal energy beam 40 is shown emanating from a source 42 to impinge on the first surface 21 of the wide-bandgap semiconductor substrate 20 for forming the nano-size conductive element 10. In one example, the thermal energy beam 40 is a beam of charged particles such as a beam of electrons or a beam of ions. The source 42 of the beam of charged particles is located within the chamber 40. In another example, the thermal energy beam 40 is a beam of electromagnetic radiation such as a laser beam. Examples of a suitable source of the laser beam include a Nd:YAG laser, a frequency double $2_\omega$ Nd:YAG laser or an Excimer laser. The source 42 of the beam of electromagnetic radiation may be located outside of the chamber 30 and being transferred through the airtight laser beam transmission window 34.

The wide-bandgap semiconductor substrate 20 may be formed as a monolith or a thin film substrate having suitable properties for forming the nano-size conductive element 10 in the wide-bandgap semiconductor substrate 20. Preferably, the wide-bandgap semiconductor 20 has a bandgap greater than 2.0 electron volts. In one example, the wide-bandgap semiconductor 20 is selected from the IV group of the periodic table and having bandgap greater than 2.0 electron volts. In a more specific example of the invention, the wide-bandgap semiconductor 20 is essentially a single crystal structure.

In still a more specific example of the invention, the wide-bandgap semiconductor 20 may be a single crystal compound. The elements of the single crystal compound selected are from the III group and the V group of the periodic table and having bandgap greater than 2.0 electron volts. Preferably, one element of the compound has a higher melting point element than the other element of the compound. Specific examples of the wide-bandgap semiconductor compound are selected from the group consisting of Aluminum Nitride, Silicon Carbide, Boron Nitride, Gallium Nitride and diamond.

The thermal energy beam 40 impinges on the wide-bandgap semiconductor substrate 20 to create the nano-size conductive element 10 within a channel 16 formed on the first side 21 of the wide-bandgap semiconductor substrate 20. In this example, the nano-size conductive element 10 is formed at the bottom of the channel 16.

Figure 3:
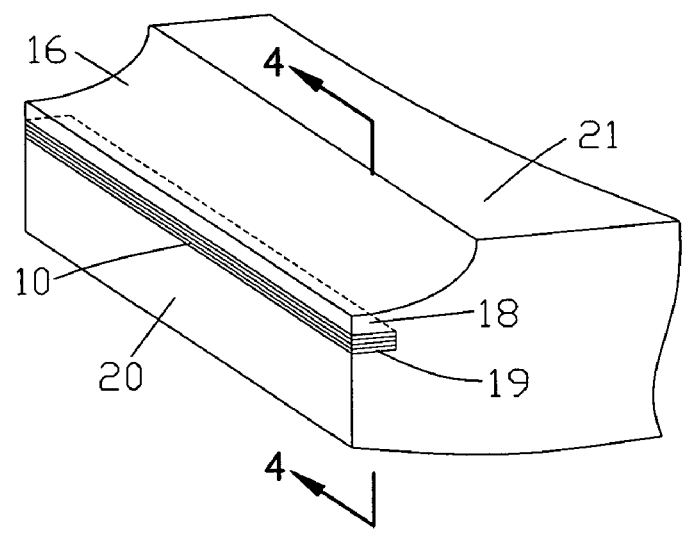
FIG. 3 is a magnified view of a portion of the nano-size conductive element of FIG. 2.

FIG. 3 is a magnified view of a portion of the wide-bandgap semiconductor substrate 20 of FIG. 2. In this example, an overlying layer 18 covers the nano-size conductive element 10. The nano-size conductive element 10 is shown as a longitudinally extending conductive ribbon 10 formed by causing relative movement between the wide-bandgap semiconductor substrate 20 and the thermal energy beam 40. The nano-size conductive element 10 terminates at an end 19.

Figure 4:
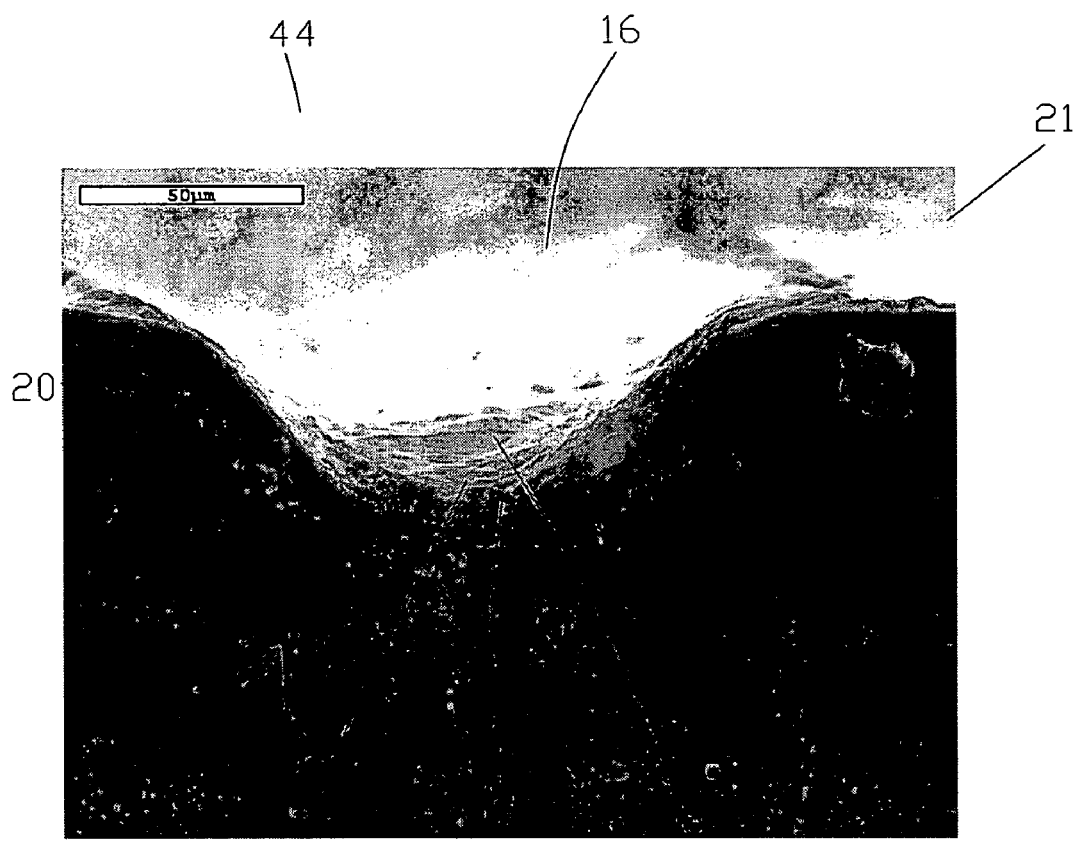
FIG. 4 is a micrograph taken along line 4—4 in FIG. 3 of the nano-size conductive element.

FIG. 4 is a micrograph taken along line 4—4 in FIG. 3 of the nano-size conductive element 10. The micrograph was taken with a high-resolution transmission electron microscope (not shown). The scale line 44 within the micrograph of FIG. 4 represents a distance of 50 micrometers. The micrograph illustrates the end 19 of the nano-size conductive element 10.

The thermal energy beam 30 impinges on the wide-bandgap semiconductor substrate 20 to create the nano-size conductive element 10. The nano-size conductive element 10 is formed at the base of the channel 16 and is covered by the overlying layer 18.

Figure 5:
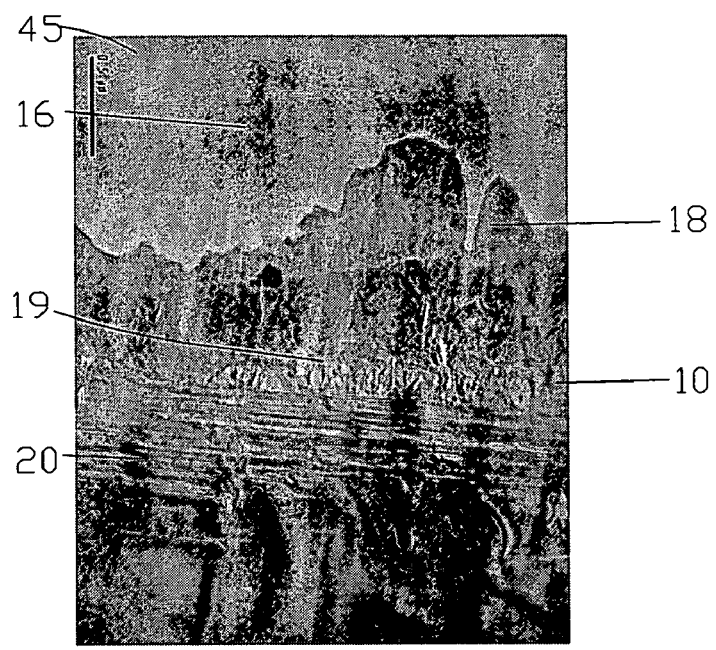
FIG. 5 is a magnification of the micrograph of FIG. 4.

FIG. 5 is a magnification of the micrograph of FIG. 4. The scale line 45 within the micrograph of FIG. 4 represents a distance of 0.50 micrometers. The wide-bandgap semiconductor substrate 20 is monolithic wafer of a single crystal Silicon Carbide. The ends 19 of the nano-size conductive element 10 are clearly shown as parallel layers or ribbons of nano-size conductive element 10. The overlying layer 18 appears to be a polycrystalline or amorphous material.

Figure 6:
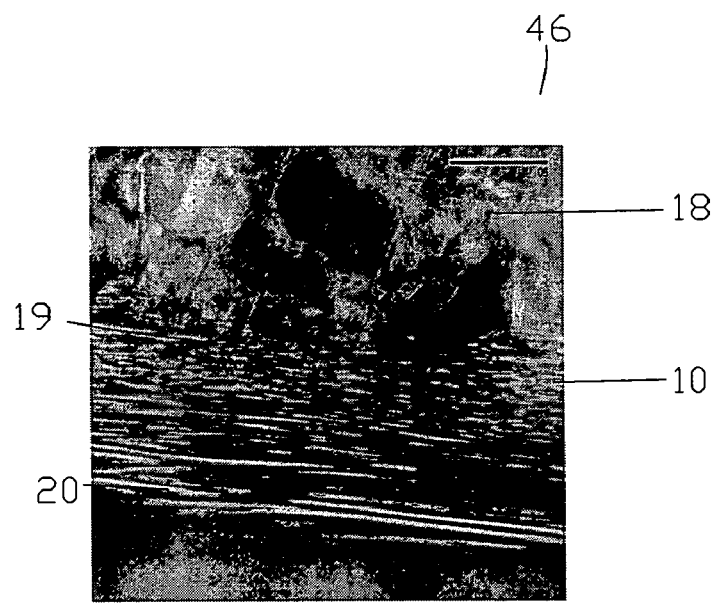
FIG. 6 is a further magnification of the micrograph of FIG. 5.

FIG. 6 is a further magnification of the micrograph of FIG. 5. The scale line 46 within the micrograph of FIG. 6 represents a distance of 50.0 nanometers. The parallel layers or ribbons of nano-size conductive element 10 have a thickness of 50 to 500 nanometers. Each individual ribbon of the nano-size conductive element 10 appears to be approximately 3 nanometers in thickness or approximately 6 atomic layers thick given an average atomic diameter on the order of 0.5 nanometers. The thermal energy beam 40 is directed onto the wide-bandgap semiconductor substrate 20 to heat a region 16 of the wide-bandgap semiconductor 20 for changing the structure of the wide-bandgap semiconductor 20 to provide the nano-size conductive element 10.

The thermal energy beam 40 is directed onto the surface 21 for heating of the region 16 the wide-bandgap semiconductor substrate 20 to change the crystalline structure of the wide-bandgap semiconductor substrate 20 to provide the nano-size conductive element 10. In this example, the nano-size conductive element 10 is formed below the surface 21 of the semiconductor substrate 20 with the overlaying layer 18 of the wide-bandgap semiconductor substrate 20 cooling the region 16 for changing the structure of the region 10 of the wide-bandgap semiconductor substrate 20 into the nano-size conductive element 10.

The exact mechanism of forming the nano-size conductive element 10 within the wide-bandgap semiconductor 20 is not filly understood at this time. One theory of the mechanism of forming the nano-size conductive element 10 comprises the use of either a single crystal wide-bandgap semiconductor 20 or an aligned polycrystalline wide-bandgap semiconductor 20.

For the sake of simplicity of explanation, we may define a single crystal wide-bandgap semiconductor as a plurality of single crystal unit cells are aligned and bounded with each other in accordance with a single pattern to form a single structure. In the polycrystalline wide-bandgap semiconductor, a plurality of single crystal unit cells are separated by grain boundaries that may not be aligned in any particular pattern. In an aligned polycrystalline wide-bandgap semiconductor, a plurality of single crystal unit cells are separated by grain boundaries that are aligned with each other in some minimal order.

It is believed that the single crystal wide-bandgap semiconductor and the aligned polycrystalline wide-bandgap semiconductor enable the thermal energy beam to penetrate into the wide-bandgap semiconductor to form the nano-size conductive element 10. It is further speculated that the polycrystalline wide-bandgap semiconductor diffuses or otherwise dissipates the thermal energy beam to prevent penetration into the wide-bandgap semiconductor.

Figure 7:
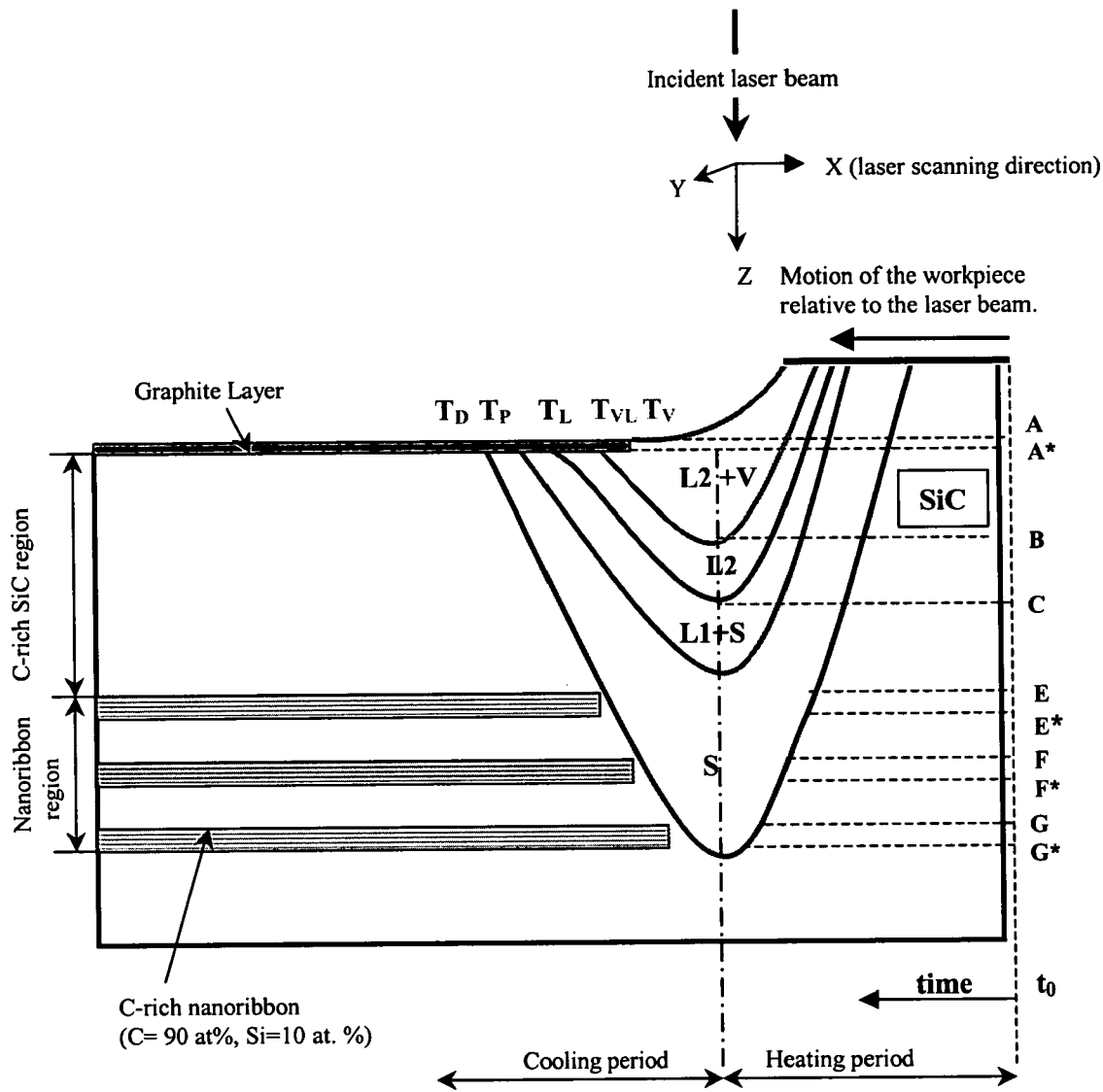
FIG. 7 is a schematic representation of the temperature distribution of a single crystal silicon carbide substrate with a laser thermal energy beam impinging thereon.

FIG. 7 is a schematic representation of the temperature distribution of a single crystal silicon carbide substrate 20 with the thermal energy beam 40 impinging thereon. The thermal energy beam 40 is shown as a laser beam.

FIG. 7 illustrates various isotherms within the wide-bandgap semiconductor substrate 20. A vaporization isotherm ($T_v$) occurs in proximity to the first side 21 of the wide-bandgap semiconductor substrate 20. The vaporization isotherm ($T_v$) represents a temperature above which the silicon carbide exists only in the vapor phase isotherm. The vaporization isotherm ($T_v$) forms a graphite layer 44 in the region A–A* on the surface 21 of the wide-bandgap semiconductor substrate 20.

A partial vaporization isotherm ($T_{VL}$) occurs below the vaporization isotherm ($T_v$) in the range A*–B. The partial vaporization isotherm ($T_{VL}$) represents a temperature above which the silicon vaporizes from the liquid phase.

A liquidus temperature isotherm ($T_L$) occurs below the partial vaporization isotherm ($T_{VL}$) in the range B–C. The partial vaporization isotherm ($T_{VL}$) represents a temperature above which the silicon carbide exists only in the liquid form according to the phase diagram of silicon carbide.

A peritectic decomposition isotherm ($T_P$) occurs below the liquidus temperature isotherm ($T_L$) in the range C–E. The peritectic decomposition isotherm ($T_P$) represents a temperature above which the silicon carbide decomposes to from liquid silicon that in turn dissolves a percentage of carbon and the rest of the carbon remains as solid particles in the liquid solution. This region is shown as the region below A deep diffusion isotherm ($T_D$) is created below the peritectic decomposition isotherm ($T_P$) in the regions E–G*. The deep diffusion isotherm ($T_D$) represents a temperature above which a results in a significant diffusion of silicon away from this silicon carbide region. The deep diffusion isotherm ($T_D$) results in the formation of the carbon rich nano-size conductive element 10 in the regions E–E*, F–F* and G–G*.

It is believed that the organization of the single crystal and/or the aligned polycrystalline wide-bandgap semiconductor substrate 20 enables the thermal energy beam 40 to uniformly heat a volume of the wide-bandgap semiconductor substrate 20. The uniform heating of the volume of the wide-bandgap semiconductor substrate 20 results in a controllable deep diffusion isotherm ($T_D$) created below the peritectic decomposition isotherm ($T_P$). The deep diffusion isotherm promotes the diffusion of the silicon away from this silicon carbide region resulting in the carbon rich nano-size conductive element 10. The nano-size conductive element 10 is carbon enriched due to the diffusion of silicon from the region of the deep diffusion isotherm ($T_D$). After the diffusion of silicon from the region of the deep diffusion isotherm ($T_D$) and the removal of the thermal energy beam 40, the carbon enriched region is recrystalized to form the nano-size conductive element 10. The nano-size conductive element 10 may be single crystal or an aligned polycrystalline in nature.

It is believed the thermal energy beam 40 changes the crystal structure of a wide-bandgap semiconductor substrate 20 formed as an single crystal or an aligned polycrystalline elemental material to provide the nano-size conductive element 10. It is further believed the thermal energy beam 40 increasing the concentration of the higher melting point element of a single crystal or an aligned polycrystalline compound material to provide the nano-size conductive element 10.

In contrast to the above, the peritectic decomposition phase 44 provided a superior micro-size electronic element for interconnecting circuit components. The present invention provides a nano-size conductive element 10 that is one-thousandth the size of the micro-size electronic element of my prior U.S. Pat. No. 5,145,741. The nano-size conductive element 10 was never observed in the formation of the graphite layer 44. It is believed that the 10 KHz laser at an average power of 35 watts power is insufficient to form the nano-size conductive element 10.

It is further believed that a 35 Khz laser having an average power of at least 40 watts of power or another type of thermal beam 40 having parameters yielding a similar amount of absorbed energy within the structure of a wide-bandgap semiconductor substrate 20 is required to create the diffusion region for creating the nano-size conductive element 10.

Figure 8:
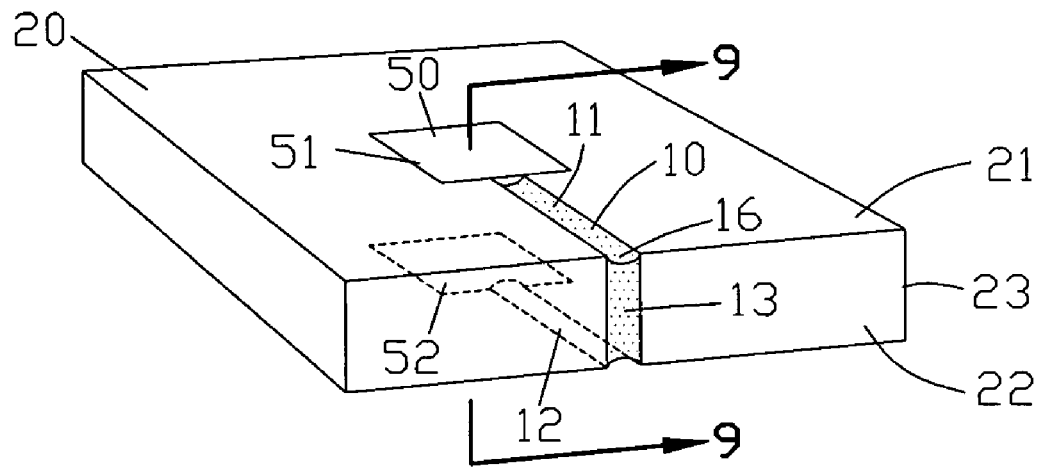
FIG. 8 is an isometric view of a nano-size conductive element interconnecting plural components located on opposed surfaces of a wide-bandgap semiconductor substrate.
Figure 9:
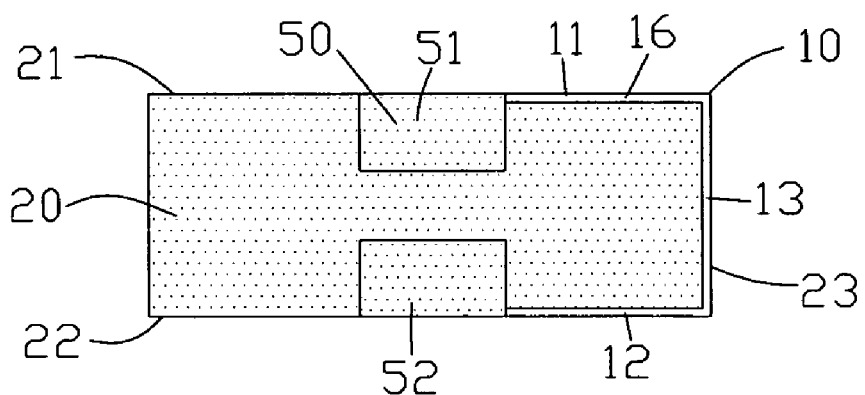
FIG. 9 is a sectional view along line 9—9 in FIG. 8.

FIGS. 7 and 8 illustrate nano-size conductive elements 10 interconnecting plural components 50. The plural components 50 are shown as a first and a second component 51 and 52 located on the first and second side 21 and 22 of the wide-bandgap semiconductor substrate 20.

The first and second components 51 and 52 may be formed by converted a portion of the first and second sides 21 and 22 of the wide-bandgap semiconductor substrate 20 into the component 51 and 52 by a laser beam. The conversion of the portions into the component 51 and 52 by a laser beam is set forth in my U.S. Pat. No. 5,145,741 and U.S. Pat. No. 5,391,841 which are incorporated by reference as if fully set forth herein.

The nano-size conductive element 10 comprises plural nano-size conductive elements 11–13 interconnecting the first and second components 51 and 52. The nano-size conductive elements 11 and 12 are located on the first and second side 21 and 22 for connection to the first and second components 51 and 52. The nano-size conductive element 13 is located on the peripheral edge 23 for interconnecting the nano-size conductive elements 11 and 12. Although the nano-size conductive element 13 is located on the peripheral edge 23 of the wide-bandgap semiconductor substrate 20, it should be understood the nano-size conductive element 13 may be formed on a small circular hole or via (not shown) extending through the wide-bandgap semiconductor substrate 20 by laser drilling and the like. A small circular hole or via (not shown) extending through the wide-bandgap semiconductor substrate 20 by laser drilling is set forth in my U.S. Pat. No. 5,391,841.

Figure 10:
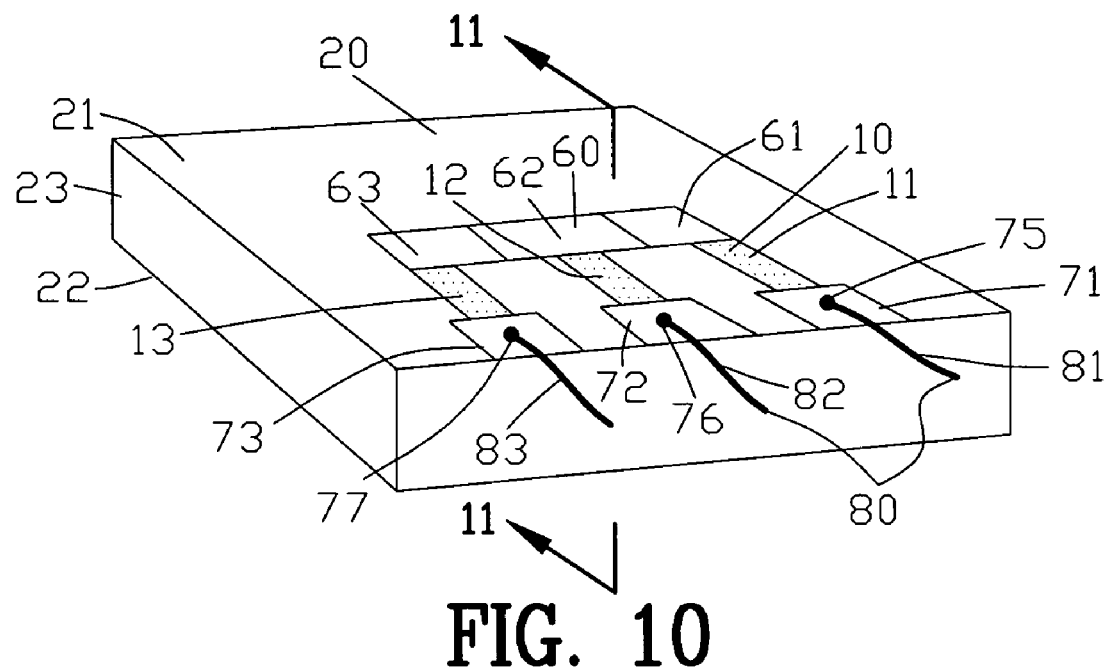
FIG. 10 is an isometric view of a plurality of nano-size conductive elements connecting a component located on a surface of a wide-bandgap semiconductor substrate to external connectors.
Figure 11:
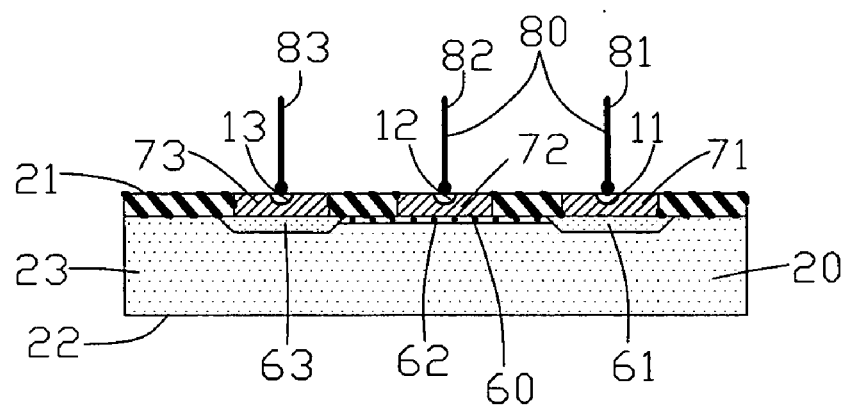
FIG. 11 is a sectional view along line 11—11 in FIG. 10.

FIGS. 10 and 11 are views of a plurality of nano-size conductive elements 10 connecting a component 60 located on a wide-bandgap semiconductor substrate 20 to external wire connectors 80. In this example, the component 60 is shown as an n-channel JFET transistor. The JFET transistor 60 comprises a source 61, a gate 62 and a drain 63. Although the component 60 has been shown as an n-channel JFET transistor, it should be understood that the component 60 may be virtually any type of electrical component.

The plurality of nano-size conductive elements 10 is shown as nano-size conductive elements 11–13 for connecting the source 61, gate 62 and drain 63 of the JFET transistor 60 to a plurality of terminals 71–73. A plurality of connection points 74–77 secure a plurality of wire connectors 81–83 to the plurality of terminals 71–73.

The following is an example of the parameters used for forming the nano-size conductive element 10 shown in micrograph in FIGS. 4–6. The nano-size conductive element 10 were formed in an atmosphere of nitrogen but it should be understood the nano-size conductive element 10 may be formed in other atmospheres including argon and the like.

EXAMPLE I

Fabricating a Nanoconductor in a Semiconductor

A 4H-Silicon Carbide single crystal substrate was irradiated with Nd:YAG, 1064 nm wavelength emisson, having a 260 ns pulse width, 35 kHz pulse repetition rate Q-switched laser, using an optimal power of 69.3 W. The 4H-Silicon Carbide single crystal substrate was positioned in an airtight chamber with an atmosphere of Nitrogen gas. The laser beam was transmitted through a soda-lime glass window. Beam scanning was achieved either by a galvo-mirror or an x-y programmable table. The beam diameter was 1.0 mm and the beam scan speed 5.0 mm/sec. Nanoribbon conductors having a nano-polycrystalline structure, as analyzed by high resolution transmission electron microscopy (Techni F30) using selected area electron diffraction (SAED) after focussed in beam milling, were formed within the substrate using an optimal intensity of 8820 $W/cm^2$ in a nitrogen environment. The heating rate and cooling rate was approximately a factor of 10 (an order or magnitude) than for micro-conductors formed in the prior art. The intensity used for the micro-conductors was 1003 $W/cm^2$. These process conditions resulted in a laser-material interaction time greater than 0.01 sec. The nano-ribbon conductors formed a heterostructure having a carbon atomic % ranging from 75–100% and a resistivity less than $10^{-2}$ ohm-cm. The nano-ribbon conductors formed in bundles 50–60 nm thick incorporating 15–17 layers.

The following is a theoretical example of expected parameters to be used for forming the nano-size conductive element 10 with a electron-gun thermal energy beam 40.

EXAMPLE II

Theoretical

Fabricating a Nanoconductor in a Semiconductor

A 4H—SiC single crystal substrate was irradiated with an electron-gun beam (Tectra e-flux, Germany) operated at 300 KV and 200 mA producing 600 W. The 4H-Silicon Carbide single crystal substrate was positioned in a vacuum chamber with the electron-gun. Exposure was either timed to simulate the interaction time created by a 5 mm/sec beam scan speed or was achieved by an x-y programmable table). The beam diameter was estimated to be 2 mm diameter. The nano-ribbon conductors having a nano-polycrystalline structure, as analyzed by high resolution transmission electron microscopy (Techni F30) using selected area electron diffraction (SAED) after focused ion beam milling, were formed within the substrate using an intensity of 19,100 W/cm2 in vacuum. The process conditions resulted in an electron beam-material interaction time greater than 0.01 sec. The nano-ribbon conductors formed a heterostructure having a carbon atomic % ranging form 75–100% and a resistivity less than $10^{-2}$ ohm-cm. The nano-ribbon conductors are formed in bundles 50–60 nm thick incorporating 15–17 layers.

The following are examples of semiconductor nanodevices and direct nanosemiconductor ribbon fabrication. Examples III–V illustrate devices that combine nanoconductors with semiconductors; the spacing of the nanoconductors can be on the order of nanometers. Advantages of these nano-device structures include:

1. Transistors: smaller gate dimensions results in higher frequency operation.
2. Diodes: smaller junction dimensions results in higher frequency operation, higher responsivity and higher sensitivity.
3. Sensors: smaller diffusion path (depth) and hence diffusion time of chemical species into the nano-structure results in faster response and detectability. The detecting surface area is large compared to the thickness (depth); on the micro- and meso-scale.

Examples VI–VII illustrate direct write fabrication of nanosemiconductor ribbons. In all these examples devices and sensors can be fabricated parallel to the surface as opposed to perpendicular to the surface.

EXAMPLE III

Theoretical

Fabricating Nanoconductors in a Semiconductor Substrate to Create Internal Conductors and Devices and Sensors A semiconductor silicon carbide single crystal substrate was irradiated with Nd:YAG, 1064 nm wavelength emission, having a 260 ns pulse width, 35 kHz pulse repetition rate Q-switched laser, using an optimal power of 69.3 W. The semiconductor silicon carbide single crystal substrate was positioned in an air-tight chamber with an atmosphere of nitrogen gas. The laser beam was transmitted through a soda-lime glass window. Beam scanning was achieved either by galvo-mirror or an x-y programmable table. The beam diameter was 1.0 mm and the beam scan speed 5.0 mm/s. The beam was focused on the substrate surface or at a depth within the surface. Nanoribbon conductors having a nano-polycrystalline structure, as analyzed by high resolution transmission electron microscopy (Techni F30) using selected area electron diffraction (SAED) after focussed ion beam milling, were formed within the substrate using an optimal intensity of 8820 W/cm2 in a nitrogen gas environment. The heating rate and cooling rate was approximately a factor of 10 (an order of magnitude) than for micro-conductors formed in the prior art. The intensity used for the micro-conductors was 1003 W/cm2. These process conditions resulted in a laser-material interaction time greater than 0.01 sec. The nanoribbon conductors formed a heterostructure having a carbon atomic % ranging from 75–100% and a resistivity less than $10^{-2}$ ohm-cm.

EXAMPLE IV

Theoretical

Laser Doping an Insulating Substrate to Create a P-Type Semiconductor Followed by Nanoconductor Fabrication to Create Devices and Sensors An insulating silicon carbide single crystal substrate was irradiated with excimer laser, 193 nm wavelength emission, having a pulse energy of 200 mJ/pulse, a pulse repetition rate of 10 Hz and 20 ns pulse width. The insulating silicon carbide single crystal substrate was positioned in an airtight chamber with an atmosphere of trimethylaluminum, a metallo-organic source for aluminum. The laser beam was transmitted through a soda-lime glass window. Beam scanning was achieved either by galvo-mirror or an x-y programmable table. The chamber was then vacuum evacuated, purged with argon and charged with nitrogen. The resultant semiconductor silicon carbide single crystal substrate was then irradiated with Nd:YAG, 1064 nm wavelength emission, having a 260 ns pulse width, 35 kHz pulse repetition rate Q-switched laser, using an optimal power of 69.3 W. Nanoribbon conductors having a nano-polycrystalline structure, as analyzed by high resolution transmission electron microscopy (Techni F30) using selected area electron diffraction (SAED) after focussed ion beam milling, were formed within the substrate using an optimal intensity of 8820 W/cm$^2$ in a nitrogen gas environment. The heating rate and cooling rate was approximately a factor of 10 (an order of magnitude) than for micro-conductors formed in the prior art. The intensity used for the micro-conductors was 1003 W/cm$^2$. These process conditions resulted in a laser-material interaction time greater than 0.01 sec. The nanoribbon conductors formed a heterostructure having a carbon atomic % ranging from 75–100% and a resistivity less than $10^{-2}$ ohm-cm.

EXAMPLE V

Theoretical

Simultaneous Laser Doping and Nanoconductor Fabrication to Create Nanosemiconductor Devices and Sensors An insulating silicon carbide single crystal substrate was irradiated with Nd:YAG, 1064 nm wavelength emission, having a 260 ns pulse width, 35 kHz pulse repetition rate Q-switched laser, using an optimal power of 69.3 W. The insulating silicon carbide single crystal substrate was positioned in an airtight chamber with an atmosphere of nitrogen gas. The laser beam was transmitted through a soda-lime glass window. Beam scanning was achieved either by galvo-mirror or an x-y programmable table. The beam diameter was 1.0 mm and the beam scan speed 5.0 mm/s. Nitrogen doping to create an n-type semiconductor and nanoribbons located at the bottom of the n-type semiconductor region were formed simultaneously. Nanoribbon conductors having a nano-polycrystalline structure, as analyzed by high resolution transmission electron microscopy (Techni F30) using selected area electron diffraction (SAED) after focussed ion beam milling, were formed within the substrate using an optimal intensity of 8820 W/cm2 in a nitrogen gas environment. The heating rate and cooling rate was approximately a factor of 10 (an order of magnitude) than for micro-conductors formed in the prior art. The intensity used for the micro-conductors was 1003 W/cm2. These process conditions resulted in a laser-material interaction time greater than 0.01 sec. The nanoribbon conductors formed a heterostructure having a carbon atomic % ranging from 75–100% and a resistivity less than $10^{-2}$ ohm-cm.

EXAMPLE VI

Theoretical

Fabricating a Nanosemiconductor by Laser Doping a Nanoribbon

A 4H-Silicon Carbide single crystal substrate was irradiated with Nd:YAG, 1064 nm wavelength emisson, having a 260 ns pulse width, 35 kHz pulse repetition rate Q-switched laser, using an optimal power of 69.3 W. The 4H-Silicon Carbide single crystal substrate was positioned in an airtight chamber with an atmosphere of Nitrogen gas. The laser beam was transmitted through a soda-lime glass window. Beam scanning was achieved either by a galvo-mirror or an x-y programmable table. The beam diameter was 1.0 mm and the beam scan speed 5.0 mm/sec. Nanoribbon conductors having a nano-polycrystalline structure, as analyzed by high resolution transmission electron microscopy (Techni F30) using selected area electron diffraction (SAED) after focussed in beam milling, were formed within the substrate using an optimal intensity of 8820 W/cm$^2$ in a nitrogen environment. The heating rate and cooling rate was approximately a factor of 10 (an order or magnitude) than for micro-conductors formed in the prior art. The intensity used for the micro-conductors was 1003 W/cm$^2$. These process conditions resulted in a laser-material interaction time greater than 0.01 sec. The nano-ribbon conductors formed a heterostructure having a carbon atomic % ranging from 75–100% and a resistivity less than $10^{-2}$ ohm-cm. The nano-ribbon conductors formed in bundles 50–60 nm thick incorporating 15–17 layers. The airtight chamber was then filled with an atmosphere of trimethylaluminum, a metalloorganic source for aluminum, to laser dope a nanoribbon region with aluminum to create a p-type nanosemiconductor ribbon region. Irradiated with an excimer laser, 193 nm wavelength emission, having a pulse energy of 200 mJ/pulse, a pulse repetition rate of 10 Hz and 20 ns pulse width was used for laser doping.

EXAMPLE VII

Directly Fabricating a Nanosemiconductor

A 4H-Silicon Carbide single crystal substrate was irradiated with Nd:YAG, 1064 nm wavelength emisson, having a 260 ns pulse width, 35 kHz pulse repetition rate Q-switched laser, using an optimal power of 69.3 W. The 4H-Silicon Carbide single crystal substrate was positioned in an airtight chamber with an atmosphere of Nitrogen gas. The laser beam was transmitted through a soda-lime glass window. Beam scanning was achieved either by a galvo-mirror or an x-y programmable table. The beam diameter was 1.0 mm and the beam scan speed 5.0 mm/sec. Nanoribbon conductors having a nano-polycrystalline structure, as analyzed by high resolution transmission electron microscopy (Techni F30) using selected area electron diffraction (SAED) after focussed in beam milling, were formed within the substrate using an optimal intensity of 8820 W/cm$^2$ in a nitrogen environment. The heating rate and cooling rate was approximately a factor of 10 (an order or magnitude) than for micro-conductors formed in the prior art. The intensity used for the micro-conductors was 1003 W/cm$^2$. These process conditions resulted in a laser-material interaction time greater than 0.01 sec. The nano-ribbon conductors formed a heterostructure having a carbon atomic % ranging from 75–100 at % and a resistivity less than $10^{-2}$ ohm-cm. The nano-ribbon conductors formed in bundles 50–60 nm thick incorporating 15–17 layers. A 25–30 at % silicon rich nanosemiconductor ribbon region is formed adjacent to the carbon rich conductor region.

Figure 12:
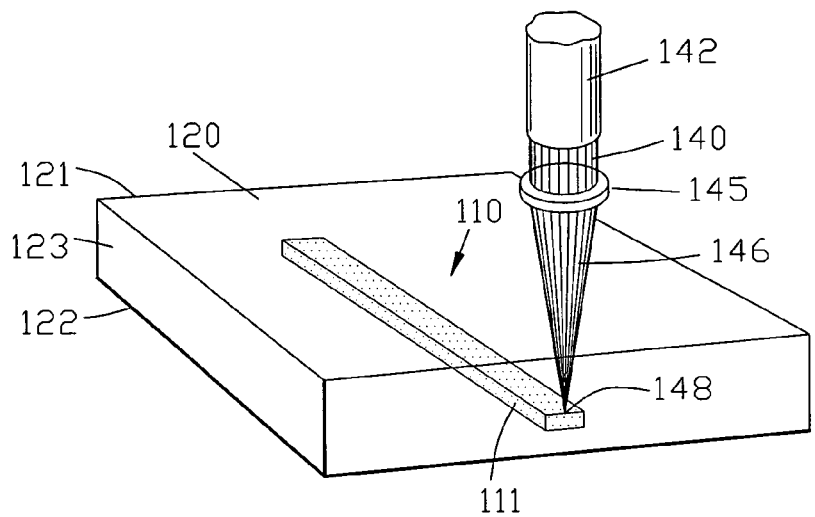
FIG. 12 is an enlarged isometric view of a nano-size conductive element formed within the wide-bandgap semiconductor substrate of FIG. 1.

FIG. 12 is an isometric view illustrating the forming a nano-size conductive element 110 within a wide band gap semiconductor substrate 120. The wide-bandgap semiconductor substrate 120 comprises a first and a second surface 121 and 122 and a peripheral edge 123. In this example, the thermal energy beam 140 is shown as a laser beam 40 generated by a laser source 142. The thermal energy beam 140 is passed through a concentrator lens 145 to form a concentrated laser beam 146 having a focal point 148.

The concentrator lens 145 is adjusted to focus the concentrated laser beam 146 with the focal point 148 located at a first position within the semiconductor substrate 120. As the laser beam 140 is moved linearly along the first side surface 121 of the semiconductor substrate 120, a first nano-size conductive element 111 is formed within the semiconductor substrate 120. Although the first nano-size conductive element 111 has been shown as a linear first nano-size conductive element 111, it should be understood by those skilled in the art that the laser beam 140 may be moved non-linearly along the first side surface 121 of the semiconductor substrate 120. The non-linear movement along the first side surface 121 of the semiconductor substrate 120 creates a non-linear or curved nano-size conductive element formed within the semiconductor substrate 120.

Figure 13:
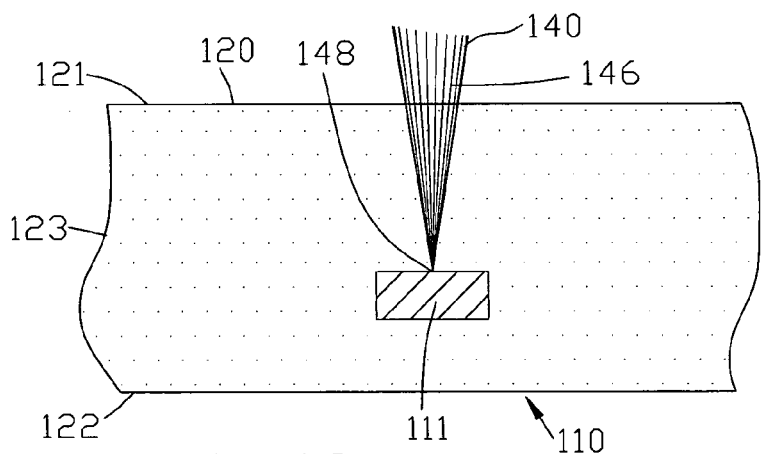
FIG. 13 is a magnified sectional view of a portion of the wide-bandgap semiconductor substrate of FIG. 12.

FIG. 13 is a magnified sectional view of a portion of the wide-bandgap semiconductor substrate of FIG. 12. The concentrator lens 145 focuses the concentrated laser beam 146 with the focal point 148 located within the semiconductor substrate 120. The concentrator lens 145 creates a concentrated beam 146A before the focal point 148 and a concentrated beam 146B beyond the focal point 148. The thermal energy generated at the focal point 148 is greater than the thermal energy generated at either the concentrated beam 146A or the concentrated beam 146B.

The first nano-size conductive element 111 is formed within the semiconductor substrate 120 by the concentrated laser beam 146 at the focal point 148 located within the semiconductor substrate 120. The laser source 142 and the concentrator lens 145 are established such that the thermal energy at the focal point 148 is sufficient to form the first nano-size conductive element 111. The thermal energy at the focal point 148 causes a migration of the silicon atoms to provide an excess of carbon atoms to create the first nano-size conductive element 111.

The concentration of thermal energy at the concentrated beam 146A and the concentrated beam 146B is insufficient form the first nano-size conductive element 111. Accordingly, the first nano-size conductive element 111 is formed within the semiconductor substrate 120 by the concentrated laser beam 146 at the focal point 148.

Figure 14:
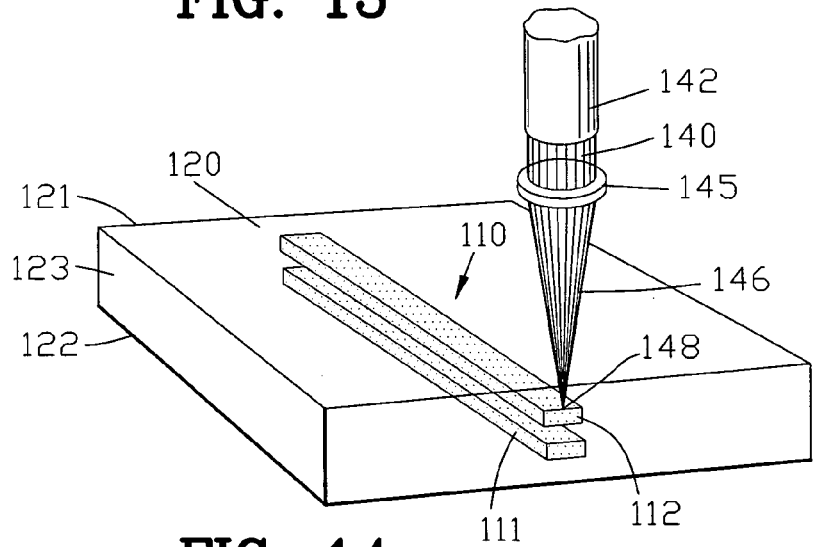
FIG. 14 is a view similar to FIG. 12 illustrating plural nano-size conductive elements formed within the wide-bandgap semiconductor substrate.

FIG. 14 is a view similar to FIG. 12 illustrating a second nano-size conductive element 112 formed within the wide-bandgap semiconductor substrate 120. The concentrator lens 145 is adjusted to focus the concentrated laser beam 146 with the focal point 148 located at a second position within the semiconductor substrate 120. The second nano-size conductive element 112 is formed within the semiconductor substrate 120 by the concentrated laser beam 146 at the focal point 148 located at the second position within the semiconductor substrate 120. Although the concentration of thermal energy has been shown as a concentration of a single laser beam 140, it should be understood that the concentration of thermal energy may be accomplished by the intersection of plural laser beams (not shown).

A nano-size conductive element (not shown) maybe formed within the wide-bandgap semiconductor substrate 120 to extend through three dimensions. The three dimensional nano-size conductive element (not shown) maybe formed by moving a laser beam in the two dimensions and simultaneously refocusing of the concentrator lens 14. In the alternative, a three dimensional nano-size conductive element (not shown) maybe formed within the wide-bandgap semiconductor substrate 120 at the intersection of plural moving laser beams (not shown).

Figure 15:
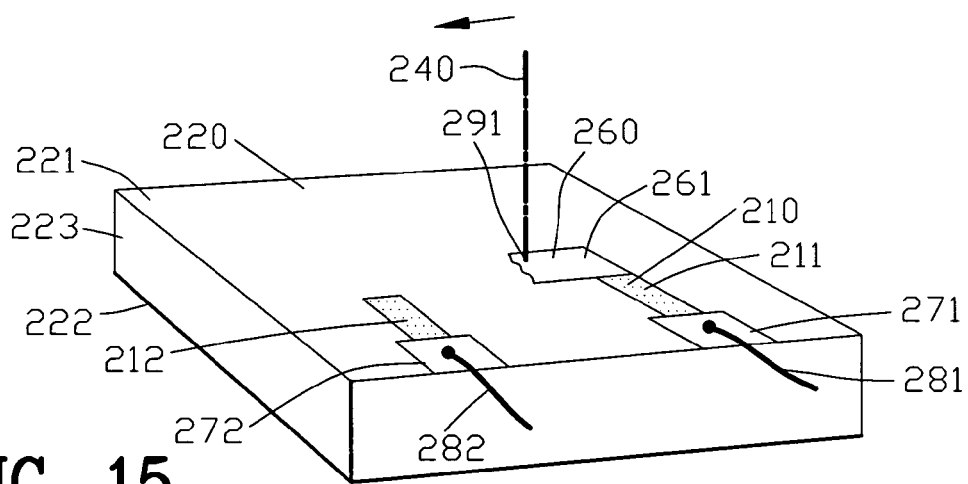
FIG. 15 illustrates a first step in a method of forming a PN junction comprising the formation of a P-type material in the single crystal silicon carbide substrate.
Figure 16:
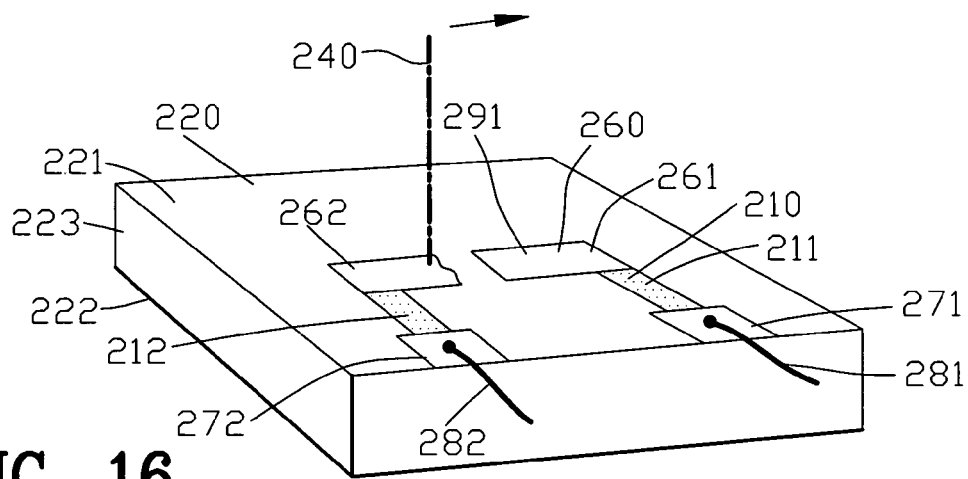
FIG. 16 illustrates a second step in the method of forming a PN junction comprising the formation of a N-type material in the single crystal silicon carbide substrate.
Figure 17:
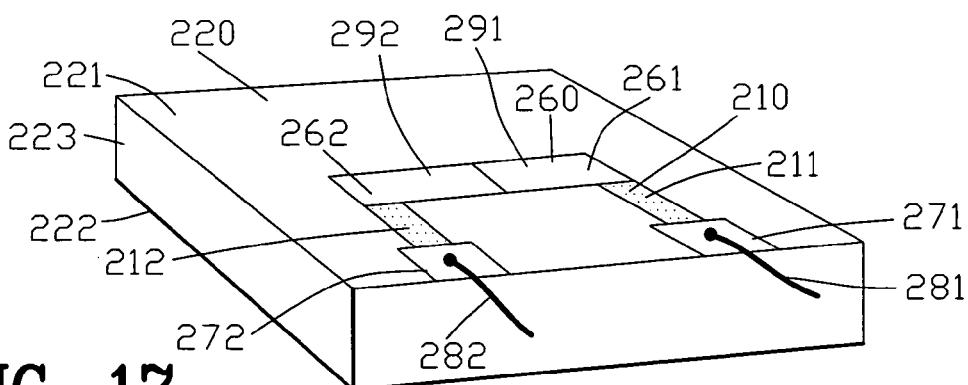
FIG. 17 illustrates the completed PN junction formed within the single crystal silicon carbide substrate in accordance with the method of the present invention.

FIGS. 15–17 illustrate the process for forming a nano-size semiconductor component 260 in a wide-bandgap semiconductor substrate 220. The wide-bandgap semiconductor substrate 220 comprises a first and a second 221 and 222 and a peripheral edge 223.

In this example, the wide-bandgap semiconductor substrate 220 is formed essentially of a single crystal compound shown as single crystal silicon carbide. Although the wide-bandgap semiconductor substrate 220 is shown as single crystal silicon carbide, it should be understood that the wide-bandgap semiconductor substrate 220 may be formed from other suitable single crystal elements and compounds.

The nano-size semiconductor component 260 is shown as a PN junction comprising the formation of a P-type material 261 and a N-type material 262 in the wide-bandgap semiconductor substrate 220. Although the component 260 has been shown as a PN junction diode 260, it should be understood that the component 260 may be virtually any type of electrical component.

The plurality of nano-size conductive elements shown as nano-size conductive elements 211 and 213 connect the P-type material 261 and a N-type material 262 of the PN junction diode 260 to a plurality of terminals 271 and 272. A plurality of wire connectors 281 and 282 are secured to the plurality of terminals 271 and 272.

FIG. 15 illustrates a first step in a method of forming the nano-size semiconductor component 260 in a wide-bandgap semiconductor substrate 220. The wide-bandgap semiconductor substrate 220 is placed within the air-tight chamber 30 shown in FIG. 1. A first atmosphere is introduced into the within the air-tight chamber 30 through the inlet and valve combination 31.

The thermal energy beam 240 is directed to impinge upon a first region 291 of the wide-bandgap semiconductor substrate 220 to form the P-type material. The thermal energy beam 240 heats the first region 291 of the wide-bandgap semiconductor substrate 220 enabling the first atmosphere 296 to react with the wide-bandgap semiconductor substrate 220. The reaction of the first atmosphere 296 with the heated wide-bandgap semiconductor substrate 220 converts the first region 291 of the wide-bandgap semiconductor substrate 220 to the P-type material 261.

FIG. 16 illustrates a second step in a method of forming the nano-size semiconductor component 260 in a wide-bandgap semiconductor substrate 220. After the formation of the P-type material 261, the first atmosphere 296 is removed from the air-tight chamber 30 through the outlet and valve combination 32. A second atmosphere 297 is introduced into the within the air-tight chamber 30 through the inlet and valve combination 31.

The thermal energy beam 240 is directed to impinge upon a second region 292 of the wide-bandgap semiconductor substrate 220 to form the N-type material 262. The thermal energy beam 240 heats the second region 292 of the wide-bandgap semiconductor substrate 220 enabling the second atmosphere 297 to react with the wide-bandgap semiconductor substrate 220. The reaction of the second atmosphere 297 with the heated wide-bandgap semiconductor substrate 220 converts the second region 292 of the wide-bandgap semiconductor substrate 220 to the N-type material 262.

FIG. 17 illustrates the completed nano-size semiconductor component 260 in the wide-bandgap semiconductor substrate 220. The P-type material 261 and the N-type material 262 form a PN junction of the nano-size semiconductor component 260. It should be understood that multiple nano-size semiconductor components (not shown) may be formed in the wide-bandgap semiconductor substrate 220.

When multiple nano-size semiconductor components are formed in the wide-bandgap semiconductor substrate 220, all P-type material components 261 are formed in a first series of operations. Thereafter, all N-type material components 262 are formed in a second series of operations.

The first and second atmospheres 296 and 297 provide a doping for the wide-bandgap semiconductor substrate 220 to form the P-type material 261 and the N-type material 262. For example, a doping of a Beta-SiC wide-bandgap semiconductor material 220 with aluminum generates a P-Type carrier material 261 (holes). A doping of a Beta-SiC wide-bandgap semiconductor material 220 with nitrogen generates a N-Type carrier material 262 (electrons).

The process for doping within chamber 30 of FIG. 1 occurs by the thermal energy beam 240 irradiating the first and second regions 291 and 292 of the wide-bandgap semiconductor substrate 220. The specialized atmosphere 296 and 297 reacts with the heated first and second regions 291 and 292 to chemically disassociate and diffuse into the heated first and second regions 291 and 292 to cause chemical, electrical and physical changes in the properties of the heated first and second regions 291 and 292 of the wide-bandgap semiconductor substrate 220.

Example VI illustrates various dopants that are suitable for use with wide-bandgap semiconductor substrate 220 such as, SiC and AlN. It should be appreciated that the dopants and resultant materials shown in Example VIII are merely illustrative of many combinations that could be selected within the scope of the teachings of the present invention.

EXAMPLE VIII

| Dopants And Materials Generated By Laser Synthesis | |
|---|---|
| Gas | Dopant |
| N-Type Doping | |
| Nitrogen | Nitrogen |
| Phosphine | Phosphorous |
| P-Type Doping | |
| Trimethyl Aluminum (TMAl) | Aluminum |
| Aluminum sec-butoxide | Aluminum |
| Di-borane | Boron |

Figure 18:
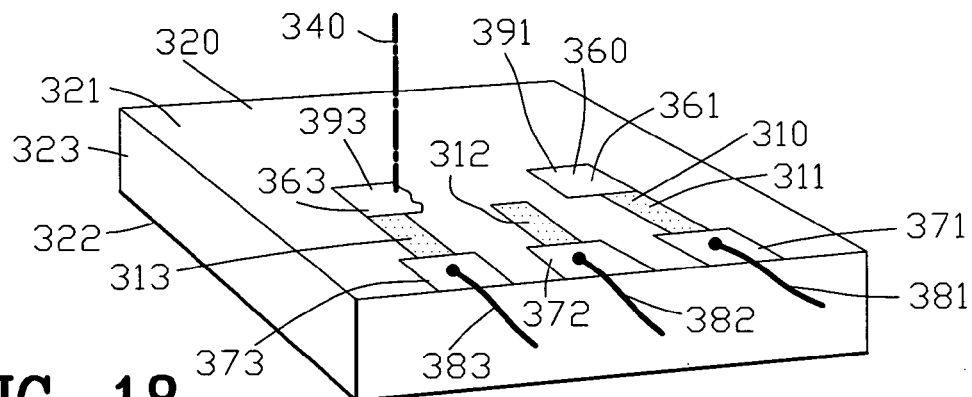
FIG. 18 illustrates a first step in a method of forming a NPN junction comprising the formation of N-type materials in a single crystal silicon carbide substrate.
Figure 19:
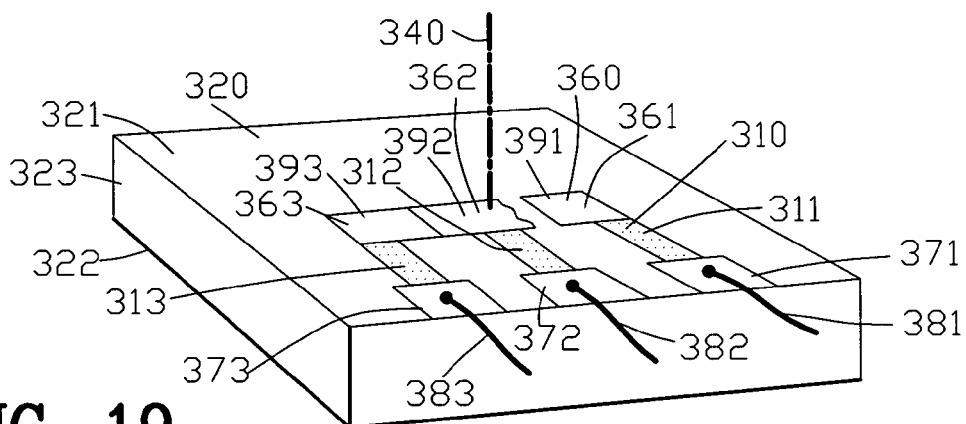
FIG. 19 illustrates a second step in the method of forming a NPN junction comprising the formation of a P-type material in the single crystal silicon carbide substrate.
Figure 20:
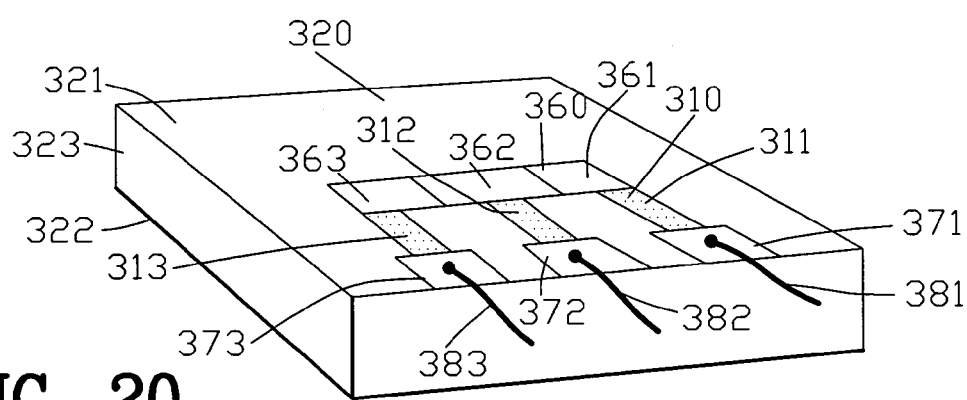
FIG. 20 illustrates the completed NPN junction formed within the single crystal silicon carbide substrate in accordance with the method of the present invention.

FIGS. 18–20 illustrate the process for forming a nano-size semiconductor component 360 in a wide-bandgap semiconductor substrate 320. The wide-bandgap semiconductor substrate 320 comprises a first and a second surface 321 and 322 and a peripheral edge 323.

In this example, the wide-bandgap semiconductor substrate 320 is formed essentially of a single crystal compound shown as single crystal silicon carbide. Although the wide-bandgap semiconductor substrate 320 is shown as single crystal silicon carbide, it should be understood that the wide-bandgap semiconductor substrate 320 may be formed from other suitable single crystal elements and compounds.

The nano-size semiconductor component 360 is shown as a NPN transistor comprising the formation of a N-type material 361, a P-type material 362 and a N-type material 363 in the wide-bandgap semiconductor substrate 320. Although the component 360 has been shown as a NPN transistor 360, it should be understood that the component 360 may be virtually any type of electrical component.

The plurality of nano-size conductive elements shown as nano-size conductive elements 311–313 connect the N-type material 361, a P-type material 362 and a N-type material 363 of the NPN transistor 360 to a plurality of terminals 371–373. A plurality of wire connectors 381–383 are secured to the plurality of terminals 371–373.

FIG. 18 illustrates a first step in a method of forming the nano-size semiconductor component 360 in a wide-bandgap semiconductor substrate 320. The wide-bandgap semiconductor substrate 320 is placed within the air-tight chamber 30 shown in FIG. 1. A first atmosphere is introduced into the within the air-tight chamber 30 through the inlet and valve combination 31.

The thermal energy beam 340 is directed to impinge upon a first region 391 and a third region 393 of the wide-bandgap semiconductor substrate 320 to form the N-type material. The thermal energy beam 340 heats the first region 391 and the third region 393 of the wide-bandgap semiconductor substrate 320 enabling the first atmosphere 396 to react with the wide-bandgap semiconductor substrate 320. The reaction of the first atmosphere 396 with the heated wide-bandgap semiconductor substrate 320 converts the first region 391 and third regions 393 of the wide-bandgap semiconductor substrate 320 to the P-type material 361.

FIG. 19 illustrates a second step in a method of forming the nano-size semiconductor component 360 in a wide-bandgap semiconductor substrate 320. After the formation of the P-type materials 361 and 363, the first atmosphere 396 is removed from the air-tight chamber 30 through the outlet and valve combination 32. A second atmosphere 397 is introduced into the within the air-tight chamber 30 through the inlet and valve combination 31.

The thermal energy beam 340 is directed to impinge upon a second region 392 of the wide-bandgap semiconductor substrate 320 to form the P-type material 362. The thermal energy beam 340 heats the second region 392 of the wide-bandgap semiconductor substrate 320 enabling the second atmosphere 397 to react with the wide-bandgap semiconductor substrate 320. The reaction of the second atmosphere 397 with the heated wide-bandgap semiconductor substrate 320 converts the second region 392 of the wide-bandgap semiconductor substrate 320 to the P-type material 362.

FIG. 20 illustrates the completed nano-size semiconductor component 360 in the wide-bandgap semiconductor substrate 320. The N-type materials 361 and 363 and the P-type material 362 form a NPN transistor of the nano-size semiconductor component 360. It should be understood that multiple nano-size semiconductor components (not shown) may be formed in the wide-bandgap semiconductor substrate 320.

Figure 21:
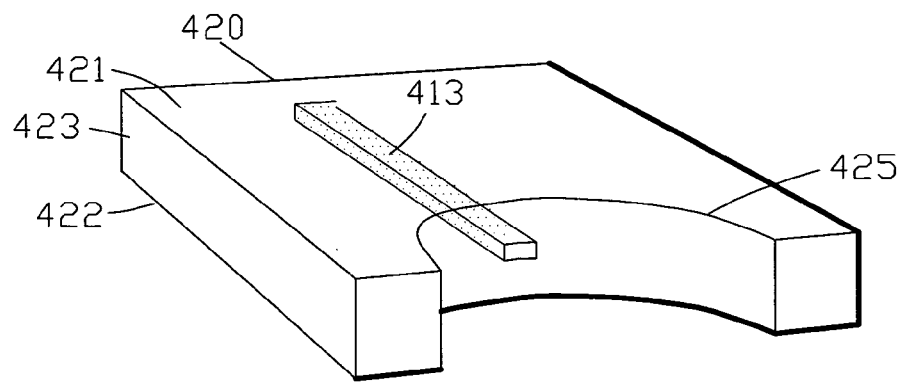
FIG. 21 illustrates a first step in a method of forming a NPN junction comprising the formation of N-type materials in a side surface of a single crystal silicon carbide substrate.
Figure 22:
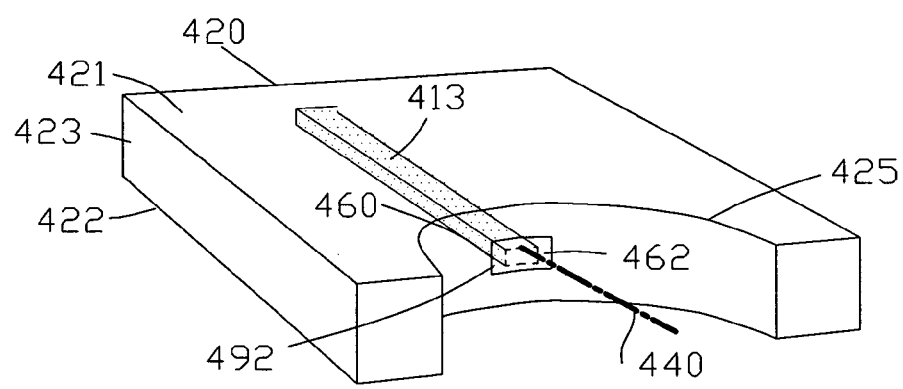
FIG. 22 illustrates a second step in the method of forming a NPN junction comprising the formation of a P-type material in the side surface of a single crystal silicon carbide substrate.
Figure 23:
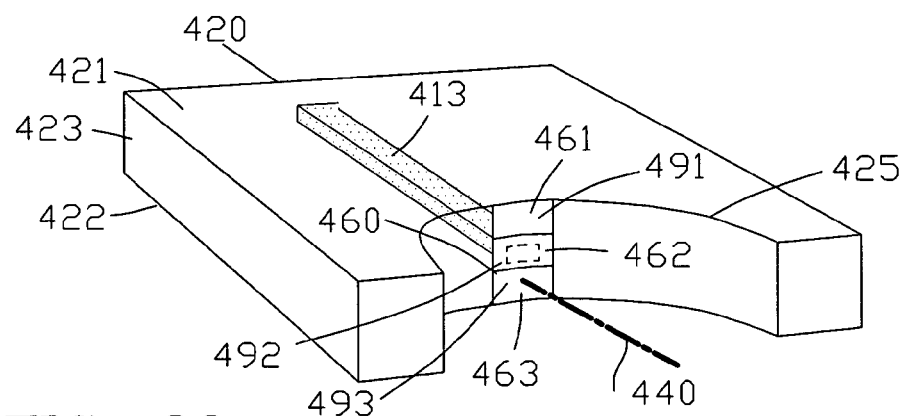
FIG. 23 illustrates the completed NPN junction formed in the side surface of a single crystal silicon carbide substrate in accordance with the method of the present invention.

FIGS. 21–23 illustrate the process for forming a nano-size semiconductor component 460 in a wide-bandgap semiconductor substrate 420. The wide-bandgap semiconductor substrate 420 comprises a first and a second surface 421 and 422 and a peripheral edge 423. In this embodiment of the invention, the nano-size semiconductor component 460 is formed in a side surface 425 of the wide-bandgap semiconductor substrate 420. The side surface 425 of a wide-bandgap semiconductor substrate 420 may be representative of a hole or a via defined in the wide-bandgap semiconductor substrate 420. The wide-bandgap semiconductor substrate 420 is formed essentially of a single crystal compound shown as single crystal silicon carbide.

FIG. 21 illustrates a first step in a method of forming the nano-size semiconductor component 460 in the side surface 425 of the wide-bandgap semiconductor substrate 420. A nano-size conductive element 413 is formed within the wide-bandgap semiconductor substrate 420. The nano-size conductive element 413 is formed within the wide-bandgap semiconductor substrate 420 through the process previously described with reference to FIGS. 12–14.

The nano-size semiconductor component 460 is shown as a NPN transistor comprising the formation of a N-type material 461, a P-type material 462 and a N-type material 463 in the wide-bandgap semiconductor substrate 420.

FIG. 22 illustrates a second step in a method of forming the nano-size semiconductor component 460 in the side surface 425 of the wide-bandgap semiconductor substrate 420. The wide-bandgap semiconductor substrate 420 is placed within the air-tight chamber 30 with the first atmosphere 496. The thermal energy beam 440 is directed to impinge upon a second region 492 of the wide-bandgap semiconductor substrate 420 to form the P-type material 462. The P-type material 462 is connected to the nano-size conductive element 413 formed within the wide-bandgap semiconductor substrate 420.

FIG. 23 illustrates a third step in a method of forming the nano-size semiconductor component 460 in a wide-bandgap semiconductor substrate 420. After the formation of the P-type materials 462, the second atmosphere 497 replaces the second atmosphere 496. The thermal energy beam 440 heats the first region 491 and the third region 493 of the wide-bandgap semiconductor substrate 420 to convert the first region 491 and third regions 493 of the wide-bandgap semiconductor substrate 420 to the N-type materials 461 and 463. It should be understood that multiple nano-size semiconductor components (not shown) may be formed in the side surface 425 of the wide-bandgap semiconductor substrate 420.

From the foregoing discussion, it can readily be appreciated that devices and circuits of the type taught and claimed herein can be produced by the appropriate selection of crystalline wide-bandgap semiconductor material; selection of an appropriate type of thermal energy source and with appropriate parameters; and using appropriate dopants. Although the wide-bandgap semiconductor material has been disclosed as a non-film structure, the present invention may be utilized on thin film structures of appropriate thickness to accommodate the formation of the devices and circuits in accordance with the teachings hereof. The thin film structures may be formed by several means known in the art such as vapor deposition techniques.

Once a layer of film has been formed on a support substrate it may be processed in a similar manner as the substrates depicted in FIGS. 1–23 in accordance with the teachings of the invention to produce devices and integrated circuits. Successive film layers may be formed and processed to produce a multi-layer structure, that represents a unique feature for using films, to create a three dimensional structure. Conductive interconnections between selected layers, devices and circuits may be made by use of conductive holes or vias.

Although the thermal energy beam has been described with reference to a beam of electromagnetic radiation such as a laser beam, it should be understood that the thermal energy beam may be a particle beam such as beam of electrons, a beam of ions and the like.

The present invention provides an improved process for forming nano-size conductive elements 10 within a wide-bandgap semiconductor substrate 20. The nano-size conductive elements 10 are formed in situ on the wide-bandgap semiconductor substrate 20 through the use of a thermal energy beam 40. The nano-size conductive elements 10 are formed by direct conversion of selected areas of the wide-bandgap semiconductor substrate 20 through the use of a thermal energy beam 40.

The present disclosure includes that contained in the appended claims as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

What is claimed is:

1. A method for making a nano-size semiconductor component within a wide-bandgap semiconductor substrate, the method comprising, the steps of:

providing a wide-bandgap semiconductor substrate;

directing a first thermal energy beam onto a first portion of the wide-bandgap semiconductor substrate for heating the first portion to change the structure of the first portion of the wide-bandgap semiconductor substrate into a first element of a semiconductor component; and directing a second thermal energy beam onto a second portion of the wide-bandgap semiconductor substrate adjacent to the first portion of the wide-bandgap semiconductor substrate for heating the second portion to form a second element of the semiconductor component.

2. A method of claim 1, in which one of the first and second thermal energy beams is selected from the group consisting of a beam of charged particles, a beam of electrons, a beam of ions, a beam of electromagnetic radiation and a laser beam.

3. A method of claim 1, in which the nano-size semiconductor component is fabricated parallel to an exposed surface.

4. A method of claim 1, in which the nano-size semiconductor component is selected from the group consisting of nanotransistors, nanodiodes, nanosensors, nano-light emitting diodes.

5. A method of claim 1, in which the nano-size semiconductor component is selected from the group consisting of circuits of nanodevices, circuits of microdevices and nanodevices and circuits of combinations of microdevices, nanodevices, nanocircuits and microciruicts.

6. A method of claim 1 where nano-size semiconductor component is directly fabricated.

7. A method of claim 1, in which one of the first and second thermal energy beams is a beam emanating from a laser of a type selected from the group consisting of Nd:YAG, frequency doubled Nd:YAG or Excimer lasers.

8. A method of claim 1, in which one of the first and second thermal energy beams is a beam emanating from a Nd:YAG laser having a wavelength emission of 1064 nanometers with a 260 nanosecond pulse width and a 35 kilohertz repetition rate at a power level of at least 40 watts.

9. A method of claim 1, in which the wide-bandgap semiconductor has a bandgap greater than 2.0 electron volts.

10. A method of claim 1, in which the wide-bandgap semiconductor is selected from the IV group of the periodic table and having bandgap greater than 2.0 electron volts.

11. A method for making a nano-size semiconductor component within a wide-bandgap semiconductor substrate, the method comprising, the steps of:

providing a wide-bandgap semiconductor substrate of essentially a single crystal compound;

directing a first thermal energy beam onto a first portion of the wide-bandgap semiconductor substrate for heating the first portion to change the crystalline compound of the first portion of the wide-bandgap semiconductor substrate into a first element of a semiconductor component; and directing a second thermal energy beam onto a second portion of the wide-bandgap semiconductor substrate adjacent to the first portion of the wide-bandgap semiconductor substrate for heating the second portion to form a second element of the semiconductor component.

12. A method of claim 11, in which the wide-bandgap semiconductor compound is selected from the III group and the V group of the periodic table and having bandgap greater than 2.0 electron volts.

13. A method of claim 11, in which the wide-bandgap semiconductor compound is of a material selected from the group consisting of Aluminum Nitride, Silicon Carbide, Boron Nitride, Gallium Nitride and diamond.

14. A method of claim 11, in which the wide-bandgap semiconductor compound has one element of the compound with a higher melting point element than the other element of the compound; and the heating of the region of the substrate increasing the concentration of the higher melting point element within the region for forming the conductive element within the wide-bandgap semiconductor substrate.

15. A method for making a nano-size field effect transistor within a wide-bandgap semiconductor substrate, the method comprising, the steps of:

providing a wide-bandgap semiconductor substrate of essentially a single crystal compound; and directing a first thermal energy beam onto a first portion of the wide-bandgap semiconductor substrate for heating the first portion to change the crystalline structure of the first portion of the wide-bandgap semiconductor substrate into a gate of the nano-size field effect transistor;

directing a second thermal energy beam onto a second portion of the wide-bandgap semiconductor substrate adjacent to the first portion of the wide-bandgap semiconductor substrate for forming a source of the of the nano-size field effect transistor; and directing a third thermal energy beam onto a third portion of the wide-bandgap semiconductor substrate adjacent to the first portion of the wide-bandgap semiconductor substrate for forming a drain of the of the nano-size field effect transistor.

16. A method of claim 15, in which one of the first and second thermal energy beams is a beam emanating from a laser of a type selected from the group consisting of Nd:YAG, frequency doubled Nd:YAG or Excimer lasers.

17. A method of claim 15, in which one of the first and second thermal energy beams is a beam emanating from a Nd:YAG laser having a wavelength emission of 1064 nanometers with a 260 nanosecond pulse width and a 35 kilohertz repetition rate at a power level of at least 40 watts.

18. A method of claim 15, in which the wide-bandgap semiconductor has a bandgap greater than 2.0 electron volts.

19. A method of claim 15, in which the wide-bandgap semiconductor is selected from the IV group of the periodic table and having bandgap greater than 2.0 electron volts.

20. A method of claim 15, in which the wide-bandgap semiconductor compound is selected from the III group and the V group of the periodic table and having bandgap greater than 2.0 electron volts.

21. A method of claim 15, in which the wide-bandgap semiconductor compound is of a material selected from the group consisting of Aluminum Nitride, Silicon Carbide, Boron Nitride, Gallium Nitride and diamond.

22. A method of claim 15, in which the wide-bandgap semiconductor compound has one element of the compound with a higher melting point element than the other element of the compound; and the heating of the region of the substrate increasing the concentration of the higher melting point element within the region for forming the conductive element within the wide-bandgap semiconductor substrate.

23. A method for making a nano-size conductive element within a wide-bandgap semiconductor substrate, the method comprising, the steps of:

providing a wide-bandgap semiconductor substrate; and focusing a thermal energy beam into a region internal the wide-bandgap semiconductor substrate for heating the region internal the wide-bandgap semiconductor substrate for changing the structure of the wide-bandgap semiconductor to provide the nano-size conductive element.

24. A method of claim 23, in which the thermal energy beam is selected from the group consisting of a beam of charged particles, a beam of electrons, a beam of ions, a beam of electromagnetic radiation and a laser beam.

25. A method of claim 23, wherein the step of focusing the thermal energy beam includes concentrating a thermal energy beam to a focal point.

26. A method of claim 23, wherein the step of focusing the thermal energy beam includes projecting two thermal energy beams to intersect within the region internal the wide-bandgap semiconductor substrate.

27. A method for making a nano-size element within a wide-bandgap semiconductor substrate, the method comprising, the steps of:

providing a wide-bandgap semiconductor substrate;

providing a doping atmosphere for the wide-bandgap semiconductor substrate; and projecting a thermal energy beam onto the wide-bandgap semiconductor substrate for heating the wide-bandgap semiconductor substrate for changing the structure of the wide-bandgap semiconductor with the doping atmosphere to provide the nano-size element.

28. A method of claim 27 wherein the doping atmosphere is selected from the group consisting of a gaseous metallo-organic doping atmosphere, a vapor metallo-organic doping atmosphere for laser doping the wide-bandgap semiconductor substrate.

29. A method of claim 27 wherein the doping atmosphere is selected from the group consisting of nitrogen or phosphorous for creating an N-type semiconductor or aluminum or boron for creating a P-type semiconductor.

30. A method for making a nano-size element within a wide-bandgap semiconductor substrate, the method comprising, the steps of:

providing a wide-bandgap semiconductor substrate;

projecting a thermal energy beam onto the wide-bandgap semiconductor substrate for heating the wide-bandgap semiconductor substrate for changing the structure of the wide-bandgap semiconductor with to provide the nano-size conducting element;

providing a doping atmosphere for the wide-bandgap semiconductor substrate; and projecting a thermal energy beam onto a portion of the nano-size conducting element for heating the portion of the nano-size conducting element in the presence of the doping atmosphere for changing the structure of the portion of the nano-size conducting element to provide the nano-size element.

* * * * *